United States Patent [19]

Shoji

[11] 4,430,583

[45] Feb. 7, 1984

[54] APPARATUS FOR INCREASING THE SPEED OF A CIRCUIT HAVING A STRING OF IGFETS

[75] Inventor: Masakazu Shoji, Warren, N.J.

[73] Assignee: Bell Telephone Laboratories, Incorporated, Murray Hill, N.J.

[21] Appl. No.: 316,560

[22] Filed: Oct. 30, 1981

[51] Int. Cl.$^3$ ............... H03K 19/017; H03K 19/094; H03K 19/09

[52] U.S. Cl. .................. 307/448; 307/452; 307/246; 307/304

[58] Field of Search ............ 307/246, 443, 448, 450, 307/451–453, 481, 304

[56] References Cited

U.S. PATENT DOCUMENTS

| | | | |
|---|---|---|---|
| 3,378,783 | 4/1968 | Gibson | 307/451 X |
| 3,551,693 | 12/1970 | Burns et al. | 307/452 X |
| 3,573,487 | 9/1971 | Polkinghorn | 307/453 |
| 3,601,627 | 8/1971 | Booher | 307/481 |
| 3,651,342 | 3/1972 | Dingwall | 307/251 |
| 3,652,906 | 3/1972 | Christensen | 307/450 X |
| 3,982,138 | 9/1976 | Luisi et al. | 307/452 X |
| 4,345,170 | 8/1982 | Sampson | 307/452 X |
| 4,389,582 | 6/1983 | Suzuki et al. | 307/452 |

Primary Examiner—Larry N. Anagnos
Attorney, Agent, or Firm—Arthur J. Torsiglieri

[57] ABSTRACT

In an IGFET circuit having a long string of more than two transistors connected in series between an output terminal and a power supply terminal where the load capacitance across the output terminal is on the same order of magnitude as the parasitic capacitances at the junctures of the transistors in the string, the switching-delay is not significantly reduced by uniformly increasing the conduction channel widths of the transistors in the string. However, according to the present invention, a substantial reduction in the switching delay of such a circuit may be obtained by scaling the conduction channel widths of the transistors in the string so as to provide a positive gradient in conduction channel widths along the string in the direction from the output terminal to the power supply terminal. It is particularly advantageous to use exponential scaling of the conduction channel widths. The present invention is also applicable to transistor strings which include one or more groups of parallel connected transistors.

6 Claims, 8 Drawing Figures

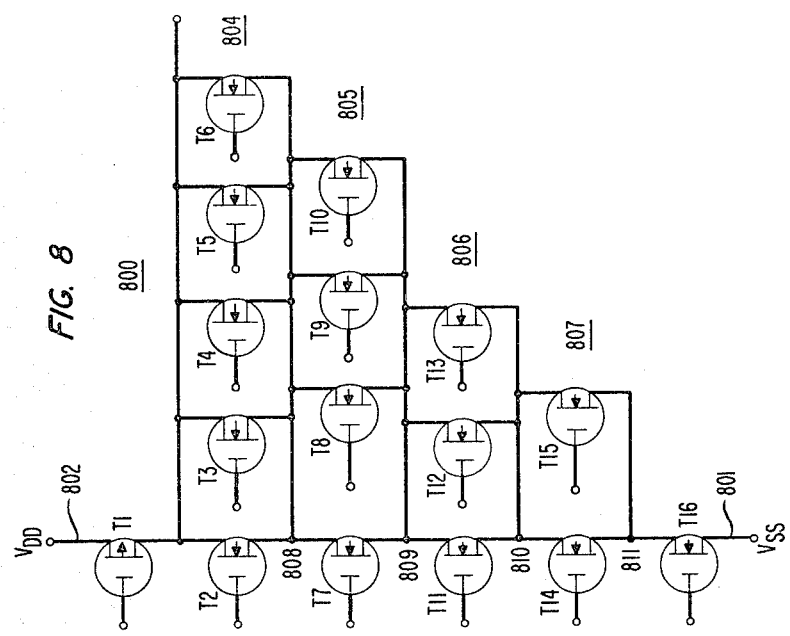
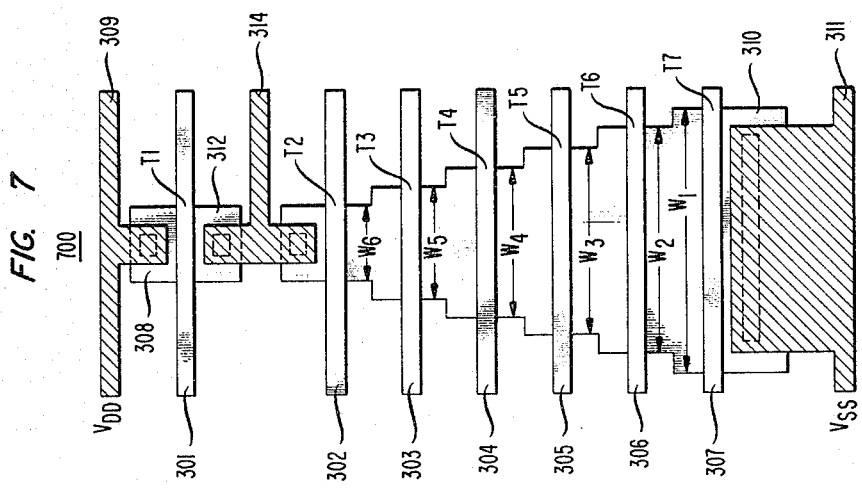

APPARATUS FOR INCREASING THE SPEED OF A CIRCUIT HAVING A STRING OF IGFETS

BACKGROUND OF THE INVENTION

This invention relates to insulated-gate field-effect-transistor (IGFET) circuits and more particularly to IGFET circuits of the type which employ a string of transistors connected in series between two terminals of the circuit.

Many well-known and widely used IGFET circuits such as multiple-input NAND gates and serial decoders require the use of a series string of two or more transistors connected in series between an output terminal and a power supply terminal. Each transistor in the string has a gate electrode connected to receive an input signal and a conduction channel connected in series with that of the other transistors in the string. When all the transistors in the string are driven to the "ON" state by appropriate input signals, the output terminal is "pulled" towards the voltage on the power supply terminal. One problem with circuits using a string of transistors is that when the number of transistors in the string is greater than two, the time required for the output terminal to reach its final voltage after all the transistors in the string are switched to the "ON" state becomes excessive for many applications requiring high switching speeds. The switching delay of such circuits depends on the time required for the load capacitance at the output terminal and the parasitic capacitances at the source/drain junctures of the transistors in the string to discharge (charge) through respective discharge (charge) paths formed by the conduction channels of the transistors in the string. Although, the conduction channel resistance of an IGFET in the "ON" state is relatively very small compared to that of an IGFET in the "OFF" state, the combined "ON" state channel resistances of several transistors connected in series is sufficient to produce excessive discharge (charge) times for the load and parasitic capacitances.

A commonly used technique for reducing the switching delay in a circuit using a string of transistors is to reduce the "ON" state channel resistance of the transistors in the string by uniformly increasing their conduction channel widths. Although this technique reduces switching delay in those applications where the load capacitance on the output terminal of the circuit is much greater than the parasitic capacitances at the source/drain junctures in the string, the technique is deficient in many applications where the load capacitance is on the same order of magnitude as the parasitic capacitances. In the latter applications a uniform increase in the widths of the transistors of the string results in little or no reduction in the switching delay.

Another known technique for reducing the switching delay in a circuit using a long string of transistors is to provide additional circuitry in parallel with the string for rapidly discharging the load capacitance in response to a predetermined voltage drop across a portion of the string. This latter technique has the deficiency of requiring additional circuitry for its implementation and, consequently, of increasing the manufacturing cost of a circuit which uses the technique.

Therefore, a need exists for apparatus which reduces the switching delay in an IGFET circuit having a string of more than two transistors which is suitable for those applications where the load capacitance on the circuit is of the same order of magnitude as the parasitic capacitance at a source/drain juncture in the string and which does not require additional circuitry.

SUMMARY OF THE INVENTION

A solution to the foregoing and other problems which overcomes the deficiencies of the prior art is an IGFET circuit having a string of transistors between the output terminal and the first terminal, the string including at least three transistors, each having a conduction channel of a specified width connected in a series with those of other transistors in the string and having a positive gradient of conduction channel widths in the direction from the output terminal to the power supply terminal for reducing the switching delay of the circuit.

BRIEF DESCRIPTION OF THE DRAWINGS

FIG. 7 is a plan view of an integrated circuit layout of the circuit of FIG. 1 according to a preferred embodiment of the present invention; and FIG. 8 is a schematic diagram of a CMOS dynamic 5432 OR-AND gate.

DETAILED DESCRIPTION

Figure 1:
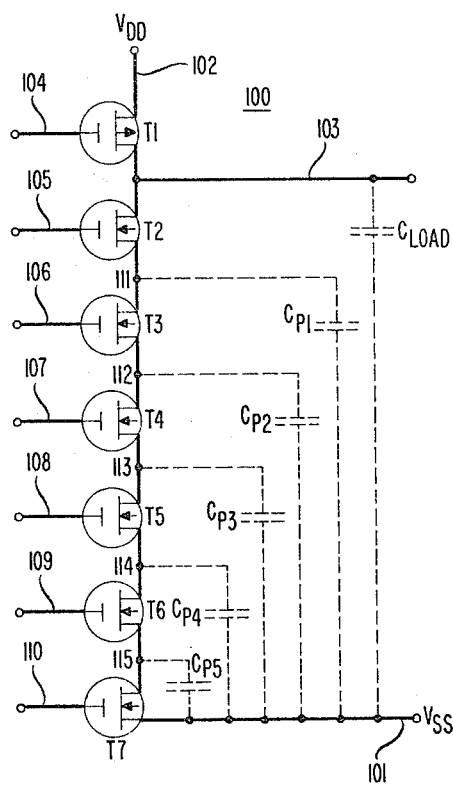
FIG. 1 is a schematic diagram of a CMOS dynamic 5-input NAND gate.

Referring now to FIG. 1, there is shown a schematic diagram of an IGFET circuit 100 which uses a string of transistors. The circuit is in the form of a complementary-metal-oxide-semiconductor (CMOS) dynamic 5-input NAND gate. The circuit includes a p-channel load transistor T1 having its conduction channel connected between a power supply terminal 102 for receiving a $V_{DD}$ supply voltage and an output terminal 103. The gate electrode 104 of T1 receives a precharge clock signal. The circuit also includes a string of six n-channel transistors T2, T3, T4, T5, T6 and T7 having their conduction channels connected in series between the output terminal 103 and a power supply terminal 101 for receiving a $V_{SS}$ supply voltage. The gate electrodes 105 through 109 of T2 through T6 each receive a respective input signal. Transistor T7 serves as a ground switch device for isolating the rest of the circuit from the $V_{SS}$ supply terminal during the precharge period. The gate electrode 110 of T7 also receives the precharge clock signal. The body of the p-channel transistor T1 is connected to the $V_{DD}$ supply terminal while the bodies of the n-channel transistors T2 through T7 are all connected to the $V_{SS}$ supply terminal.

The output terminal 103 has an associated load capacitance denoted by $C_{LOAD}$. This capacitance includes the drain junction capacitances of T1 and T2, stray wiring capacitances and the input capacitances of other circuits connected to the output terminal. In addition, each of the transistor junctures 111 through 115 along the string has an associated parasitic capacitance denoted by $C_{P1}$, $C_{P2}$, $C_{P3}$, $C_{P4}$, and $C_{P5}$, respectively. These capacitances include the source and drain junction capacitances of the transistors connected at the junctures.

During the precharge period when the precharge clock signal is a logic "0" level of approximately $V_{SS}$, T1 is in the "ON" state, T7 is in the "OFF" state and $C_{LOAD}$ is charged to approximately $V_{DD}$. Normally, the input signals at gate electrodes 105 through 109 are also at logic "1" levels during the precharge period. Therefore, the parasitic capacitances $C_{P1}$ through $C_{P5}$ are also charged to approximately $V_{DD}$ during that period.

Upon termination of the precharge period, the precharge clock signal goes to a logic "1" level of approximately $V_{DD}$ to drive T1 to the "OFF" state and T2 to the "ON" state. Under these conditions the logic state at the output terminal is a NAND function of the logic states of the input signals at terminals 105 through 109. If the input signals are all at logic "1" levels, T2 through T6 are driven into the "ON" state, and the output terminal is pulled to a logic "0" level of approximately $V_{SS}$ through the conduction channels of transistors T2 through T7.

The switching delay between the time when the precharge clock signal and the input signals are all at logic "1" levels and the time when the output terminal reaches its final logic "0" level is dependent on the time required for $C_{LOAD}$ and $C_{P1}$ through $C_{P5}$ to discharge through their respective discharge paths created by the "ON" state conduction channels of T2 through T7. The discharge time for the capacitances on the string increases with increasing values of the capacitances and with increasing values of the resistances of their respective discharge paths. Since the resistances of the discharge paths are proportional to the number of transistors in such paths, the discharge time increases with increasing numbers of transistors in the string. Therefore, the switching delay of the circuit increases with increasing numbers of transistors in the string.

Figure 2:
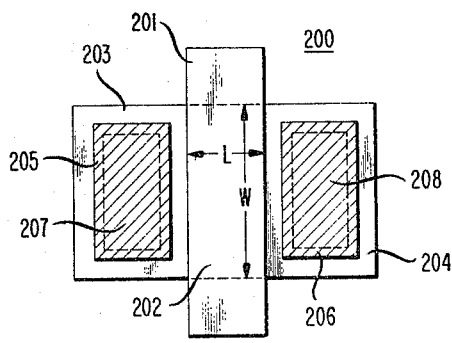
FIG. 2 is a plan view of an insulated gate field effect transistor.

Turning now to FIG. 2, there is shown a plan view of a typical IGFET in the form of a metal-oxide semiconductor (MOS) transistor 200. The transistor includes a relatively highly doped polysilicon strip 201 serving as the gate electrode. The polysilicon strip overlies a lightly doped bulk region of one conductivity type and is insulated therefrom by a relatively thin (~400 Angstroms) silicon dioxide layer in a defined region 202 and a relatively thick silicon dioxide region (~10,000 Angstroms) in other regions. The surface portion of the bulk region directly beneath the thin oxide layer is the conduction channel of the transistor. On two sides of the conduction channel and insulated from the polysilicon strip by the thick oxide layer are relatively heavily doped source and drain regions 203 and 204 normally formed by diffusion and having a conductivity type opposite to that of the bulk region. Metal layers 205 and 206 which make electrical contact to the source and drain regions through contact windows 207 and 208, respectively, serve as the source and drain electrodes of the transistor. In general the source and drain electrodes of an IGFET, which provide electrical connections to the ends of the conduction channel through respective diffused regions, are interchangeable with one another.

In the absence of an appropriate bias on the gate electrode, the conduction channel has a relatively high resistance of several hundred megohms. However, when an appropriate bias is applied to the gate electrode with respect to the bulk region to drive the transistor to the "ON" state, the conduction channel acquires a relatively low resistance. The "ON" state conduction channel resistance is inversely proportional to the ratio of the channel width, W, to the channel length, L. This ratio is commonly referred to as the channel aspect ratio and may be altered by changing either the channel width or the channel length. However, it is a common practice in integrated circuit design to fix the channel length, L, for all transistors in a given circuit. Therefore, the "ON" resistance of a transistor is normally altered by changing the conduction channel width, W.

Since the source and drain diffused regions 203 and 204 each form a pn junction with the bulk region, a parasitic junction capacitance with respect to the bulk region is associated with each of the source and drain electrodes. The value of the parasitic junction capacitance is proportional to the area of the respective diffused region. Normally, the widths of the source and drain diffused regions are both equal to the width of the conduction channel. Therefore, the parasitic source and drain junction capacitances of an IGFET are proportional to the conduction channel width of the IGFET.

Figure 3:
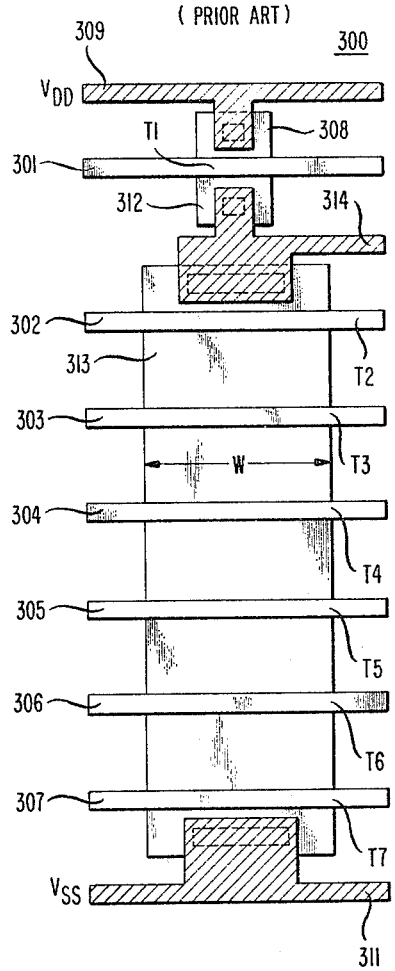
FIG. 3 is a plan view of an integrated circuit layout of the circuit of FIG. 1 according to the prior art.

Referring now to FIG. 3 there is shown a plan view of a layout 300 of the circuit of FIG. 1 according to the prior art. The polysilicon strips 301 through 307 serve as the gate electrodes of T1 through T7, respectively. The p-channel transistor T1 is formed over n-type bulk region while the n-channel transistors T2 through T7 are formed over p-type bulk region. The source electrode 308 of T1 is connected to a metal strip 309 which serves as the $V_{DD}$ supply voltage terminal. The source electrode 310 of T7 is connected to a metal strip 311 which serves as the $V_{SS}$ supply voltage terminal. The drain electrode 312 of T1 and the drain electrode 313 of T2 are both connected to a metal strip 314 which serves as the output terminal. The series connections among T2 through T7 are made by joining together the appropriate diffused source/drain regions of those transistors. Typically, T2 through T7 all have the same conduction channel width, W.

As discussed above, owing to the relatively large number of transistors in the string, the switching delay of the circuit tends to be excessively long. A prior art technique for reducing the switching delay is to reduce the "ON" resistance of T2 through T7 by increasing their conduction channel widths, W. However, I have found that where the load capacitance on the output terminal of the circuit is of the same order of magnitude as (less than a factor of ten greater than) each of the parasitic capacitances at the source/drain junctures along the string, increasing the conduction channel widths of the transistors in the string uniformly by any amount produces little or no reduction in the switching delay of the circuit. Since in most integrated circuit applications the load capacitance, which comprises primarily the input capacitances of other circuits on the same chip, is of the same order of magnitude as any one of the parasitic capacitances on the junctures of the string, the prior art technique for reducing switching delay has little effect in such applications.

Figure 4:
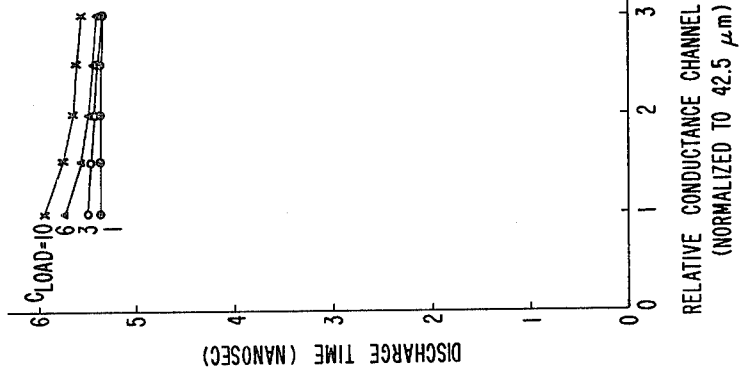
FIG. 4 is a graph showing the relation of the discharge time of a six transistor uniform string to the conduction channel width of the transistors in the string, the several curves representing various values of load capacitance.

Referring now to FIG. 4, there is shown a graph illustrating the relation of the discharge time of a string of six transistors having uniform conduction channel widths to the conduction channel width of the transistors. The four curves depicted represent four different values of the load capacitance as indicated on each curve. The conduction channel width is normalized to a standard width of 42.5 μm, and the load capacitance is normalized to the parasitic capacitance at the juncture of two transistors having the standard conduction channel width (0.026 pf). The discharge time of the string is defined as the time required for the voltage at the output terminal to go from $V_{DD}$ (5 volts) to $V_{DD}/2 - V_{SS}/2$ (2.5 volts) after all transistors in the string are driven to the "ON" state. The graph shows that where the load capacitance is of the same order of magnitude as the parasitic junction capacitance at the juncture of two transistors, increasing uniformly the conduction channel width of the transistors in the string yields little or no improvement in the discharge time of the string. One reason for this seemingly paradoxical result is that increasing the conduction channel widths of the transistors of the string causes at the same time a decrease in the "ON" resistances of the transistors and an increase in the source/drain junction capacitances of the transistors. The increase in the source/drain junction capacitances at least partially cancels the improvement in the discharge time afforded by the decrease in the "ON" resistances.

However, I have discovered that even where the load capacitance is comparable to the parasitic junction capacitances, the discharge time of a long string can be significantly decreased by requiring the conduction channel widths of the transistors in the string to be scaled so as to provide a positive gradient in conduction channel widths along the string in the direction from the output terminal to the power supply terminal. Such a gradient is obtained by requiring the transistor nearest the $V_{SS}$ supply terminal to have the largest conduction channel width, the transistor second nearest the $V_{SS}$ supply terminal to have the second largest conduction channel width, the transistor third nearest the $V_{SS}$ supply terminal to have the third largest conduction channel width and so on for the rest of the string. The transistor nearest the output terminal is required to have the smallest conduction channel width in the string. The present invention is intended primarily for use in strings having transistors of uniform conduction channel length. However, the invention may also be advantageously used in strings having transistors of nonuniform conduction channel length.

Figure 5:
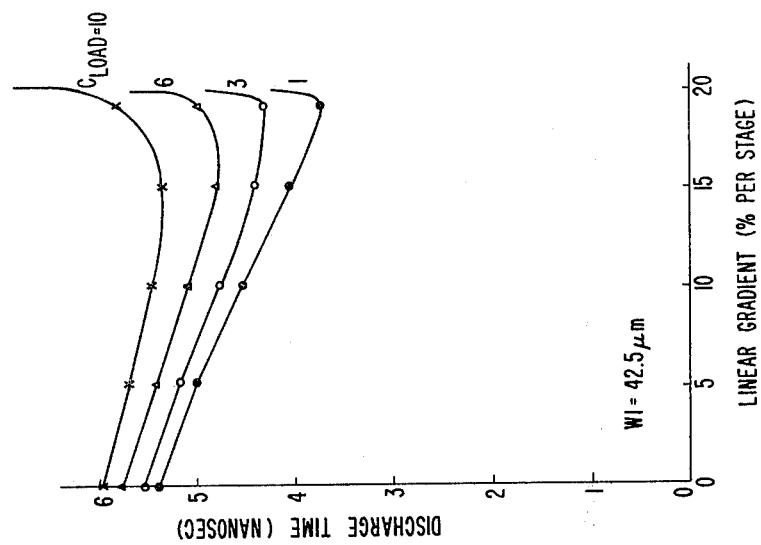
FIG. 5 is a graph showing the relation of the discharge time of a six transistor string having linearly scaled conduction channel widths to the percent change in conduction channel width per transistor, the several curves representing various values of load capacitance.

Referring now to FIG. 5, there is shown a graph illustrating the relation of the discharge time of a six transistor string having a positive linear conduction channel width gradient to the magnitude of that gradient. The four curves depicted represent four different values of the load capacitance as indicated on each curve. The magnitude of the gradient is given in percent increase in conduction channel width per transistor and the load capacitance is normalized to the parasitic junction capacitance at the juncture of two transistors having the conduction channel widths of 42.5 μm. The graph shows that in a string having a linear conduction channel width gradient the discharge time of the string decreases significantly as the magnitude of the gradient is increased up to some maximum gradient. Where the value of $C_{LOAD}$ is small, the maximum usable gradient approaches asymptotically that which causes the conduction channel width of the transistor nearest the output terminal (minimum conduction channel width) to go to zero. For larger values of $C_{LOAD}$, the maximum usable gradient is smaller. In practice, the maximum usable gradient is limited by the minimum conduction channel width that can be by the fabrication process used for the manufacture of the circuit.

It should be noted that according to the present invention, a reduction in the discharge time of a string is obtained not by increasing the width of any transistors in the string but rather by decreasing according to some scaling function the conduction channel widths of all transistors in the string except for the one nearest the power supply terminal which is made to have the maximum conduction channel width in the string. Therefore, in addition to improving circuit performance, the present invention can also provide a reduction in the chip area occupied by the circuit.

For a given gradient, the discharge time of the string can be further decreased by increasing the maximum conduction channel width in the string. A larger maximum conduction channel width also permits the use of a larger maximum gradient for the string but increases the chip area occupied by the circuit string.

For a given maximum conduction channel width some types of nonlinear conduction channel width gradients are more effective in reducing the discharge time of the string than linear gradients. For example, it is advantageous to scale the conduction channel widths exponentially according to the relationship:

$$W_n = \lambda^{n-1} W_1,$$

where W1 is the conduction channel width of the transistor nearest the power supply terminal, Wn is the conduction channel width of the nth transistor from the power supply terminal, and λ is a scaling parameter which is less than unity.

Figure 6:
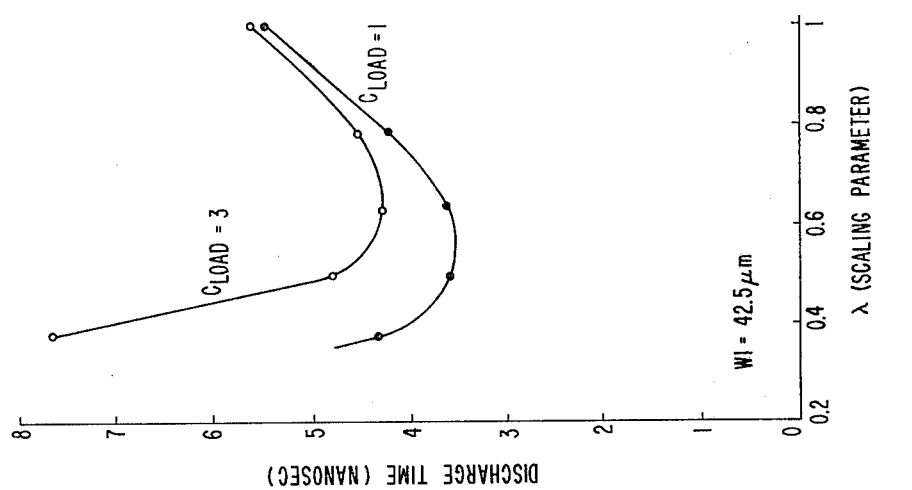
FIG. 6 is a graph showing the relation of the discharge time of a six transistor string having exponentially scaled conduction channel widths to the scaling parameter, $\lambda$, the two curves representing two different values of load capacitance, respectively.

Referring now to FIG. 6, there is shown a graph illustrating the relationship between the discharge time of a six transistor exponentially scaled string and the scaling parameter, λ. The conduction channel widths in the string are scaled according to the above relationship using W1 = 42.5 μm. The two curves depicted in the FIG. 6 represent the cases of $C_{LOAD}=1$ and $C_{LOAD}=3$, respectively. In both cases the discharge time at first decreases with decreasing values of λ, reaching a minimum, and then increases with decreasing values of λ. The minimum discharge time in each case is less than that which is obtainable with linear scaling for the same value of W1. The value of the scaling factor, $\lambda_0$, at which the discharge time is a minimum is given by the relation:

$$W1 = \frac{C_{LOAD}}{A} \cdot \frac{1 - (1/\lambda_0)^N}{1 - (1/\lambda_0)}$$

where N is the number of transistors in the string and A is an empirical constant which is in the range of $300 \times 10^{-12}$ farads/cm to $400 \times 10^{-12}$ farads/cm.

Referring now to FIG. 7, there is shown a layout 700 of the circuit of FIG. 1 according to a preferred embodiment of the present invention. Reference characters used to refer to the layout of FIG. 3 are also being used to refer to corresponding components of FIG. 7. The conduction channel widths W1, W2, W3, W4, W5, and W6 of T7, T6, T5, T4, T3 and T2, respectively, are selected so as to provide a positive exponential gradient in conduction channel width in the direction from the output terminal 314 to the power supply terminal 311. The scaling factor λ is selected to be 0.65 to provide minimal discharge time for a string in which W1=42.5 μm and $C_{LOAD}$=0.078 picofarads. According to that scaling factor, the values of W2, W3, W4, W5 and W6 are 27.6 μm, 17.9 μm, 11.7 μm, 7.6 μm, and 4.9 μm, respectively.

The connections among T2 through T7 are made by joining appropriate diffused regions of those transistors. However, such connectors can also be made on other conductor levels by providing contacts between such conductor levels and the appropriate diffused regions.

Although in the preferred embodiment of the present invention, a gradient in conduction channel width is provided over the entire length of the string, significant advantages may also be derived in some cases by providing a gradient over successive transistors in only a portion of the string. For example, in the circuit of FIG. 1 a substantial reduction in the discharge time of the string may be achieved by scaling the conduction channel widths of only T4, T5, T6 and T7 while making the conduction channel widths of T2, T3 and T4 equal. However, a gradient extending over only a portion of the string is generally less effective in reducing the discharge time of the string than one extending over the entire string.

The present invention is also applicable where the string includes one or more groups of parallel connected transistors. An example of such a string is found in the CMOS dynamic 5432 OR-AND gate shown in the schematic diagram of FIG. 8. Referring now to FIG. 8, the circuit 800 depicted therein uses a string which includes four groups 804, 805, 806, and 807 of parallel connected n-channel transistors T2 through T15 and an individual n-channel transistor T16. The gate electrodes of T2 through T15 receive respective input signals while the gate electrode of T16 receives the precharge clock signal. When one or more transistors in each group and T16 are in the "ON" state, the output terminal is pulled toward $V_{SS}$ through the conduction channels of those transistors. In general, the switching delay of a string having parallel transistors is longer than that of a string of individual transistors because the parasitic capacitances at the junctures of parallel transistors such as 808 through 811 are larger than those at the junctures of a string of individual transistors. Consequently, the discharge time of the string having one or more groups of parallel transistors is longer, even though the total resistance through a group of parallel transistors may be less than that of an individual transistor.

As in the case of a string of individual transistors, uniformly increasing the conduction channel widths of the transistors in a string having parallel transistors provides little or no improvement in the discharge time of the string. However, a significant improvement in discharge time is obtained by providing such a string with positive gradient in conduction channel widths in the direction from the output terminal to the power supply terminal. For example, such a gradient may be provided in the string of the circuit in FIG. 8 by requiring T16 to have the largest conduction channel width in the string, T14 and T15 to both have the second largest conduction channel width in the string, T11, T12, and T13 to all have the third largest conduction channel width in the string and so on for the rest of the string. It is also advantageous to scale the conduction channel widths exponentially in the manner described for the string of individual transistors, although significant reductions in discharge time may also be obtained with other types of nonlinear or linear scaling.

It will be understood by those skilled in the art that the foregoing and other modifications and alterations may be made to the described embodiments without departing from the spirit or scope of the present invention. For example, the transistors in the string may be of p-channel conductivity type instead of n-channel conductivity type, the string may be used in static circuit instead of a dynamic circuit, the string may be used in a p-type metal-oxide-semiconductor (PMOS) or n-type metal-oxide-semiconductor (NMOS) circuit instead of a CMOS circuit, and the string may be connected between the output terminal and the $V_{DD}$ supply terminal instead of between the output terminal and the $V_{SS}$ terminal.

What is claimed is:

1. An IGFET circuit comprising:
a first terminal for receiving a first operating voltage;
a second terminal for receiving a second operating voltage;
an output terminal for providing an output signal;
load means coupled between the second terminal and the output terminal;
a series string of transistors each having a gate electrode and a conduction channel of a specified width, the string including at least three transistors responsive to input signals at their gate electrodes and coupled between the output terminal and the first terminal and having a positive gradient in conduction channel width in the direction from the output terminal to the first terminal.

2. An IGFET circuit as recited in claim 1 wherein the transistors of the string have conduction channel lengths which are uniform and conduction channel widths which are scaled exponentially.

3. An IGFET circuit is recited in claim 2 wherein the conduction channel widths of the transistors in the string are scaled exponentially according to a scaling factor, λ, determined substantially by the relation:

$$W1 = \frac{C_{LOAD}}{A} \cdot \frac{1 - (1/\lambda)^N}{1 - (1/\lambda)}$$

where W1 is the conduction channel width of a transistor nearest the first terminal, $C_{LOAD}$ is the total capacitance between the output terminal and the first terminal in farads, N is an integer equal to the number of transistors scaled, and A is a constant in the range of $300 \times 10^{-12}$ farads/cm to $400 \times 10^{-12}$ farads/cm.

4. An IGFET circuit as recited in claims 1, 2 or 3 wherein the positive gradient in conduction channel width extends over the entire string.

5. An IGFET circuit as recited in claims 1, 2 or 3 wherein the series string includes one or more groups of transistors, each group having two or more transistors having their conduction channels coupled in parallel.

6. An IGFET circuit as recited in claims 1, 2, or 3 wherein the series string includes one or more groups of transistors, each group having two or more transistors having their conduction channels coupled in parallel and the positive gradient in conduction channel width extends over the entire string.

* * * * *